United States Patent
Hayashi et al.

(10) Patent No.: US 8,003,898 B2
(45) Date of Patent: Aug. 23, 2011

(54) SEAL STRUCTURE

(75) Inventors: Takahiro Hayashi, Fujisawa (JP); Makoto Hora, Fujisawa (JP); Keiichi Miyajima, Fujisawa (JP)

(73) Assignee: NOK Corporation (JP)

( * ) Notice: Subject to any disclaimer, the term of this patent is extended or adjusted under 35 U.S.C. 154(b) by 250 days.

(21) Appl. No.: 12/439,130

(22) PCT Filed: Sep. 10, 2007

(86) PCT No.: PCT/JP2007/068015
§ 371 (c)(1),
(2), (4) Date: Feb. 26, 2009

(87) PCT Pub. No.: WO2008/038533
PCT Pub. Date: Apr. 3, 2008

(65) Prior Publication Data
US 2009/0250261 A1    Oct. 8, 2009

(30) Foreign Application Priority Data
Sep. 28, 2006    (JP) ................................ 2006-264602

(51) Int. Cl.
*H01L 23/02*    (2006.01)
*H05K 5/06*    (2006.01)
*H05K 9/00*    (2006.01)

(52) U.S. Cl. ........................ 174/385; 455/575.1; 174/564

(58) Field of Classification Search ................. 174/520, 174/559, 564, 385; 455/575.1, 575.3
See application file for complete search history.

(56) References Cited

U.S. PATENT DOCUMENTS

| | | | | |
|---|---|---|---|---|
| 5,247,424 A | * | 9/1993 | Harris et al. ................. | 361/704 |
| 5,406,027 A | * | 4/1995 | Matsumoto et al. .......... | 174/546 |
| 5,491,300 A | * | 2/1996 | Huppenthal et al. .......... | 174/151 |
| 7,251,512 B2 | * | 7/2007 | Komiyama ................ | 455/575.3 |
| 2002/0005574 A1 | * | 1/2002 | Zhou ............................. | 257/680 |
| 2002/0098736 A1 | * | 7/2002 | Hattori et al. ................. | 439/587 |
| 2003/0211873 A1 | | 11/2003 | Komiyama | |
| 2004/0169146 A1 | * | 9/2004 | Maydanich et al. ..... | 250/363.03 |
| 2006/0032653 A1 | * | 2/2006 | Minoshima et al. ......... | 174/52.3 |
| 2006/0185881 A1 | | 8/2006 | Minoshima et al. | |

FOREIGN PATENT DOCUMENTS

| | | |
|---|---|---|
| EP | 1496587 A1 | 1/2005 |
| GB | 2 390 235 A | 12/2003 |
| JP | 58-19415 U | 2/1983 |
| JP | 2003-142836 A | 5/2003 |
| JP | 2004-47968 A | 2/2004 |
| JP | 2004-214927 A | 7/2004 |
| WO | WO-03/085793 A1 | 10/2003 |

* cited by examiner

*Primary Examiner* — Hung Ngo
(74) *Attorney, Agent, or Firm* — Harness, Dickey & Pierce, P.L.C.

(57) ABSTRACT

To provide a seal structure which has a seal member integrally formed on a flexible wiring board without peeling off an insulating layer (top coat) of the flexible wiring board, has excellent sealing performance and can be manufactured at a low cost, the seal structure is composed of a housing, to which the flexible wiring board is inserted, and the seal member, which is integrally formed with the flexible wiring board and seals a gap between the housing and the flexible wiring board, the flexible wiring board is composed of a base FPC composed of an elastic material, a patterned copper foil and an adhesive layer, conductive electromagnetic shielding layers formed on surfaces of the base FPC, and insulating layers covering surfaces of the electromagnetic shielding layers, and the seal member is integrally formed directly on the insulating layers by using a self-adhesive liquid rubber.

8 Claims, 4 Drawing Sheets

SEAL STRUCTURE

CROSS-REFERENCE TO RELATED APPLICATIONS

This is a national stage of the International Application No. PCT/JP2007/068015 filed on Sep. 10, 2007 and published in Japanese language.

BACKGROUND OF THE INVENTION

1. Field of the Invention

The present invention relates to a seal structure.

The present invention, more particularly, relates to a seal structure providing a waterproof structure of an electronic device and a connector.

2. Description of the Conventional Art

In recent days, a waterproof connector used in an electronic device such as a cellular phone or the like, a wire harness for a motor vehicle and the like makes progress in downsizing, and a high waterproof function is demanded.

In order to provide the waterproof function to the electronic device comprising a plurality of spaces, it is necessary to provide airtightness to a housing constructing each of the spaces, and electrically connect between the spaces by a flexible board or the like.

In this case, there have been proposed a method of setting a terminal at a wall surface of the housing comparting each of the spaces, and connecting between the terminals by a wiring member, and a method of setting the wiring member through the wall surface of the housing and filling a gap made between the wiring member and the housing with an adhesive agent or the like.

However, the constitution that the terminal is provided at the wall surface of the housing has a problem that the device is enlarged in size. The method of filling the gap made between the wiring member and the housing with the adhesive agent or the like causes a problem that disassembly and reassembly are difficult.

Accordingly, as shown in FIGS. 4 and 5, there has been proposed a constitution of integrally molding seal members with a flexible wiring board (Japanese Unexamined Patent Publication No. 2003-142836 and Japanese Unexamined Patent Publication No. 2004-214927).

In a constitution shown in FIG. 4, frame body shaped seal members 301 corresponding to shapes of respective housings (not shown) are integrally formed with a flexible wiring board 100.

The flexible wiring board 100 extends through each of the seal members 301, and electronic parts are mounted within regions surrounded by the respective seal members 301.

Further, in a constitution shown in FIG. 5, bush shaped seal members 303 are integrally formed with a flexible wiring board 100.

The seal members 303 are installed to insertion holes provided in respective housings (not shown).

Further, connectors 304 provided at both ends of the flexible wiring board 100 are electrically connected to electric parts within the housings.

However, each of the flexible wiring boards 100 with shielding layers shown in FIGS. 4 and 5 is provided with the following structure.

Electromagnetic shielding layers using a silver paste are provided on both surfaces of a base FPC which is structured such that a circuit pattern made of a cupper foil is sandwiched by an elastic material such as a polyimide, a polyamide, a polyester, a liquid crystal polymer, a polyethylene naphthalate or the like, and insulating layers are formed on surfaces of the electromagnetic shielding layers for protecting and electrically insulating the surfaces.

This insulating layer is called as a top coat, and an alkyd resin is used.

However, the insulating layer has a bad affinity with respect to the seal members 301 and 303, and it is hard to integrally fix the seal members 301 and 303 on the insulating layer.

Therefore, there has been employed a method of peeling off the insulating layer at a position where the seal member 301 or 303 is arranged, and then integrally forming the seal members 301 or 303 thereon.

Accordingly, it takes a lot of work to peel off the insulating layer, and a manufacturing cost is high.

Further, since the insulating layer is peeled off even partly, a service life of the electromagnetic shielding layer is adversely affected.

SUMMARY OF THE INVENTION

Problem to be Solved by the Invention

The present invention is made by taking the points mentioned above into consideration, and an object of the present invention is to provide such a seal structure that seal members can be integrally formed on a flexible wiring board without peeling off an insulating layer (a top coat) of the flexible wiring board, so that a sealing performance is good, and a manufacturing cost is inexpensive.

Further, in addition thereto, another object of the present invention is to provide such a seal structure that work for applying an adhesive agent treatment on a surface of the insulating layer can be omitted, and assembling work can be easily done.

Means for Solving the Problem

In order to achieve the object mentioned above, in accordance with the present invention, there is provided a seal structure comprising:

a housing to which a flexible wiring board is inserted; and a seal member integrally formed with the flexible wiring board for sealing a gap between the housing and the flexible wiring board, wherein the flexible wiring board is constructed by a base FPC made of an elastic material, a patterned copper foil and an adhesive layer, conductive electromagnetic shielding layers formed on surfaces of the base FPC, and insulating layers covering surfaces of the electromagnetic shielding layers, and wherein the seal member is integrally formed directly on the insulating layers by using a self-adhesive liquid rubber.

Effect of the Invention

The present invention achieves effects as described below.

In accordance with a first aspect of the seal structure of the invention, since it is not necessary to peel off the insulating layer, it is possible to inexpensively manufacture, and it is easy to integrate the seal member and the flexible wiring board.

Further, in accordance with a second aspect of the seal structure of the invention, it is possible to more securely integrate the seal member and the flexible wiring board, and an electric characteristic is good.

Further, in accordance with a third aspect of the seal structure of the invention, it is possible to more securely integrate the seal member and the flexible wiring board, and a heat resisting property is good.

Further, in accordance with a fourth aspect of the seal structure of the invention, it is possible to more securely integrate the seal member and the flexible wiring board, and it is possible to inexpensively manufacture it.

Further, in accordance with a fifth aspect of the seal structure of the invention, it is possible to securely prevent water from intruding into an electronic device.

Further, in accordance with a sixth aspect of the seal structure of the invention, it is possible to enhance a water proofing performance of a cellular phone which makes progress in downsizing and a weight saving.

Further, in accordance with a seventh aspect of the seal structure of the invention, it is possible to enhance a water proofing performance of a water proof connector which makes progress in downsizing and a weight saving.

Further, in accordance with an eighth aspect of the seal structure of the invention, it is possible to more securely achieve water proofing and electric connection between a plurality of housings.

Further, in accordance with a ninth aspect of the seal structure of the invention, it is possible to enhance a water proofing performance of a whole region including mating faces of the housing.

Further, in accordance with a tenth aspect of the seal structure of the invention, it is possible to securely seal between an insertion hole provided in the housing and the flexible wiring board.

Further, in accordance with an eleventh aspect of the seal structure of the invention, it is possible to apply it to various housing shapes.

DETAILED DESCRIPTION OF PREFERRED EMBODIMENT

A description will be given below of preferred embodiment of the present invention.

A description will be given of the preferred embodiment of the present invention on the basis of FIGS. 1 to 3.

Figure 1:
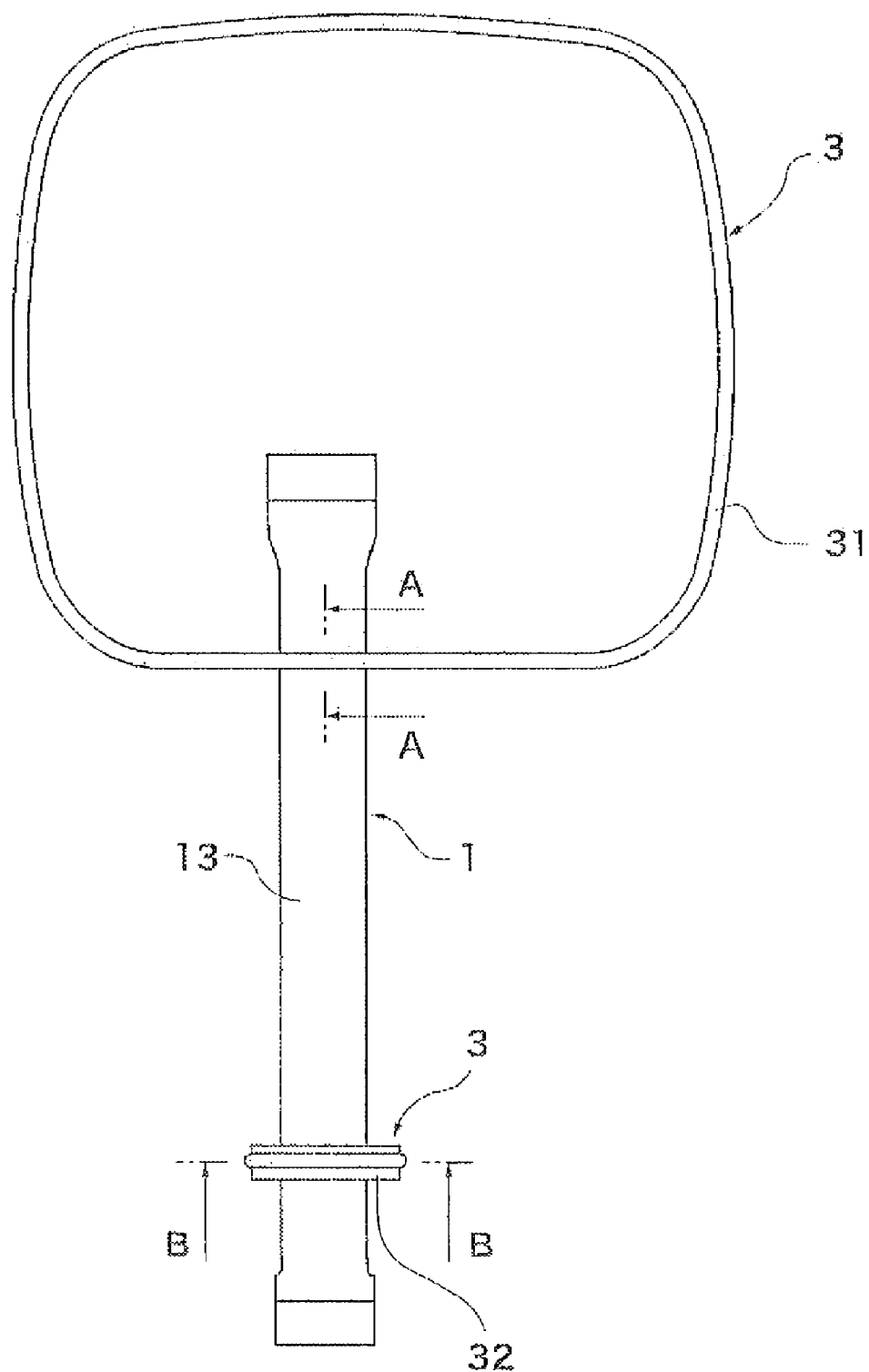
FIG. 1 is a plan view showing an embodiment in accordance with a seal structure of the present invention.
Figure 2:
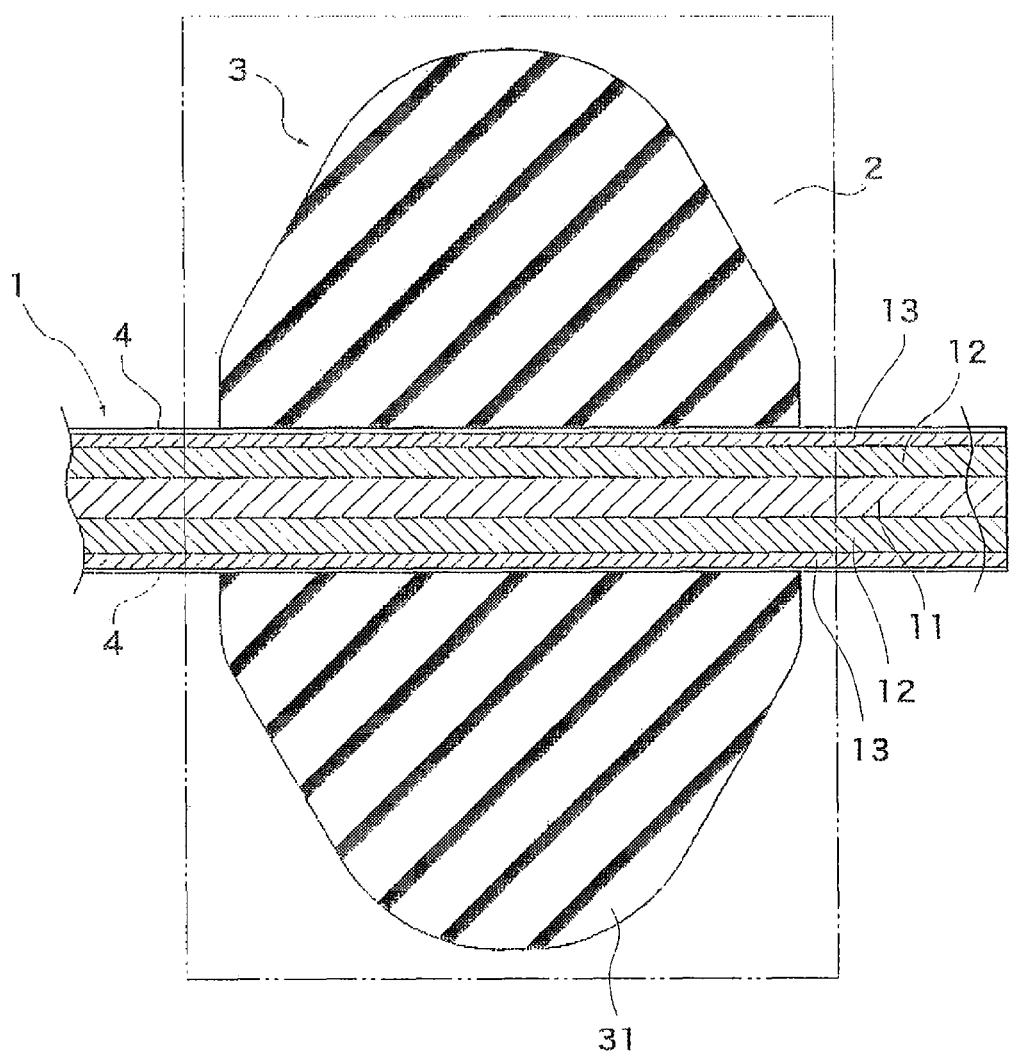
FIG. 2 is a sectional view along a line A-A in FIG. 1.
Figure 3:
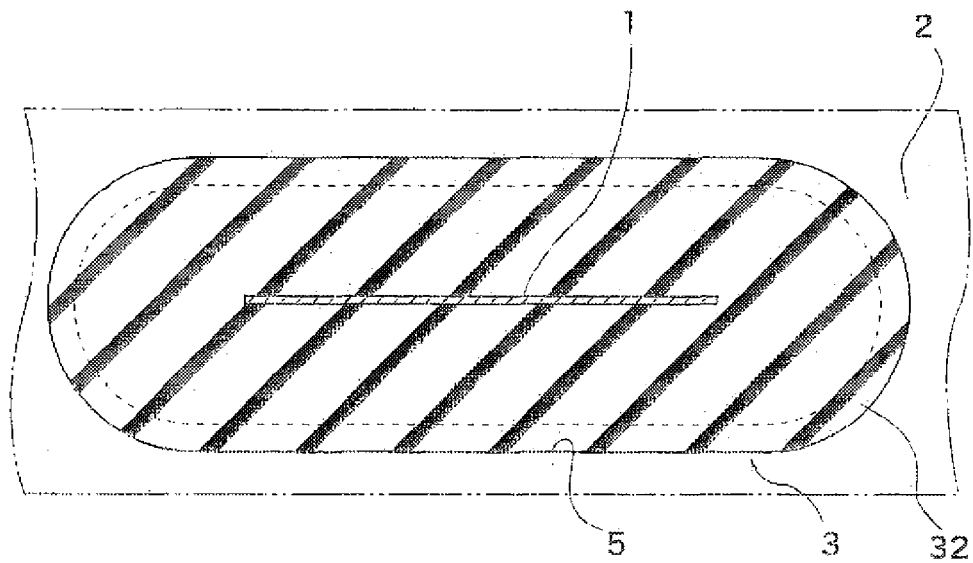
FIG. 3 is a sectional view along a line B-B in FIG. 1.
Figure 4:
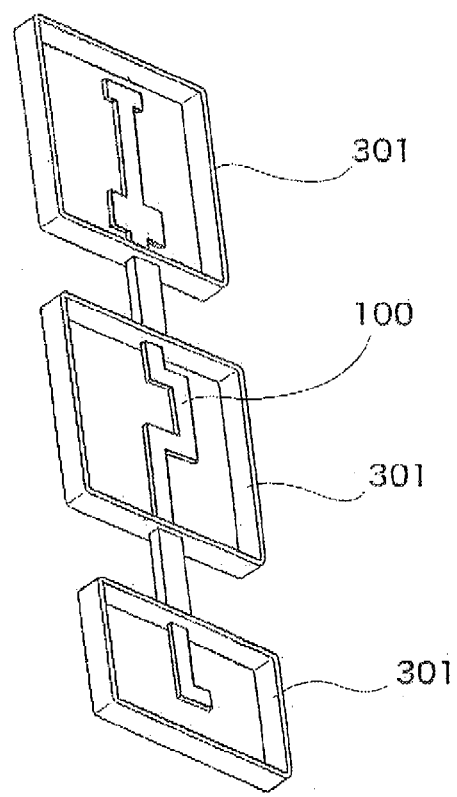
FIG. 4 is a plan view showing a seal structure in accordance with a conventional art.
Figure 5:
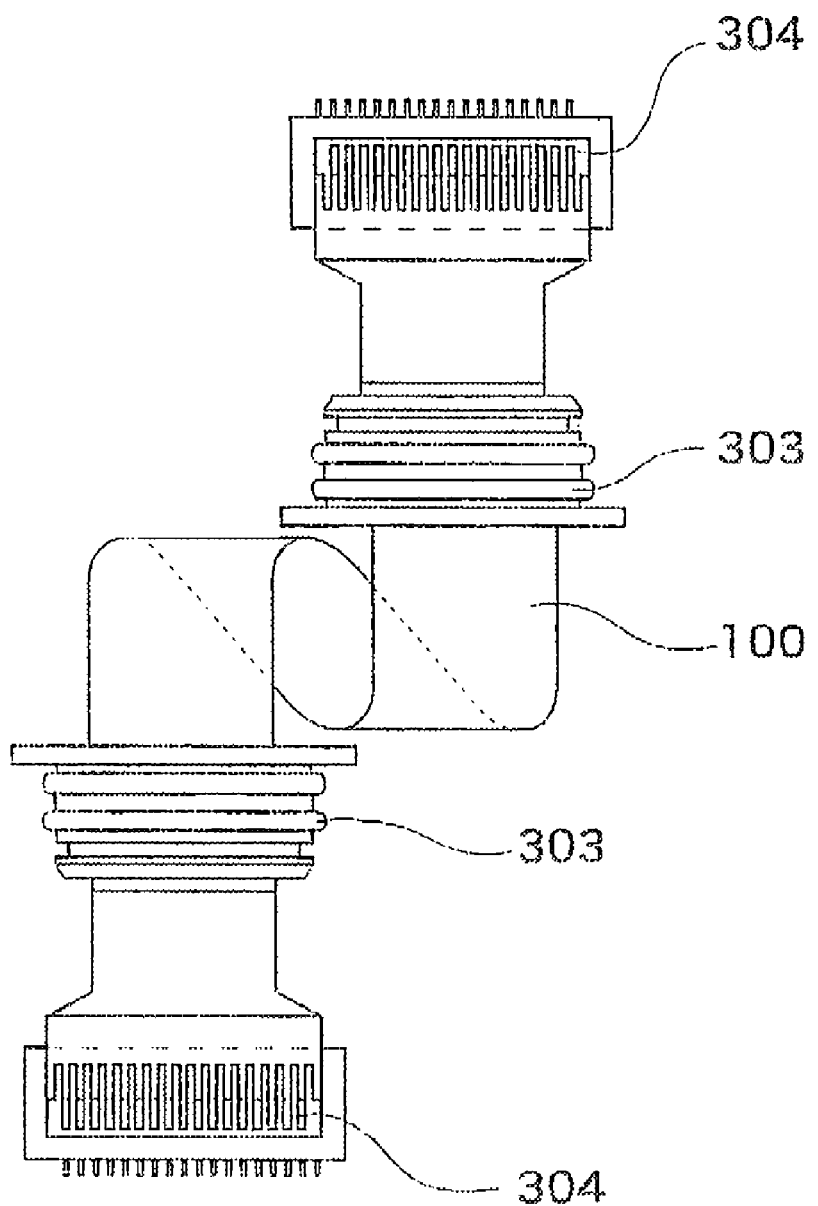
FIG. 5 is a plan view showing a seal structure in accordance with another conventional art.

FIG. 2 is a sectional view along a line A-A in FIG. 1, and FIG. 3 is a sectional view along a line B-B in FIG. 1.

In the figure, seal members 3 and 3 having different shapes are integrally formed near both ends of a flexible wiring board 1.

The seal member 3 at an upper side of the figure is a frame body shaped seal 31 for simultaneously sealing a gap between mating faces of housings 2 and a gap between the housing 2 and the flexible wiring board 1, and the seal member 3 at a lower side of the figure is a bush shaped seal 32 for sealing a gap between an insertion hole provided in the housing and the flexible wiring board 1.

Further, the flexible wiring board 1 is provided with the following structure.

Electromagnetic shielding layers 12 and 12 using a silver paste are adhesively fixed to both surfaces of a base FPC 11 constituted by an elastic material such as a polyimide, a polyamide, a polyester, a liquid crystal polymer or the like, and a copper foil patterned by etching and integrated on a surface of the elastic material via an adhesive layer. In this case, the base FPC 11 generally employs a sandwich structure of polyimide-copper foil-polyimide.

Next, insulating layers 13 and 13 are formed on surfaces of the electromagnetic shielding layers 12 and 12 for protecting the surface.

The insulating layer 13 is called as a top coat and an alkyd resin or the like is used.

Further, the seal members 3 and 3 employ a self-adhesive type silicone rubber corresponding to a self-adhesive liquid rubber. As the self-adhesive type silicone rubber, there can be listed up X-34-1277A/B, X-34-1547A/B, X-34-1464A/B or the like made by Shin-Etsu Silicon Co., Ltd.

As the self-adhesive liquid rubber in this case, it is possible to use a self-adhesive type silicone rubber, a liquid fluorine-contained rubber (Sifel 600 series), a liquid EPDM or the like.

A seal member 13 is integrally formed directly on the insulating layer 13 of the flexible wiring board 1 which is previously completed into a target shape by using the self-adhesive type silicone rubber.

The frame body shaped seal 31 and the bush shaped seal 32 are both baked and integrated on the flexible wiring board 1 by using a metal mold.

Both the seal members 3 and 3 seal a gap between mating faces 4 and 4 of the housing 2, and a gap between the insertion hole 5 provided in the housing and the flexible wiring board 1.

The housing 1 may be a frame body of a cellular phone or a connector housing.

Further, a shape of the seal member 3 can employ various shapes in addition to the frame body shaped seal 31 and the bush shaped seal 32.

Further, the number of the seal member 3 attached to the flexible wiring board 1 is set to two in the embodiment, however, may be set to three or more in correspondence to a structure of the target device.

Needless to say, the present invention is not limited to embodiment of the invention mentioned above, but can employ the other various structures unless deviating from the gist of the present invention.

INDUSTRIAL APPLICABILITY

The present invention can be utilized in an electronic device such as a cellular phone or the like, a wire harness for a motor vehicle, and the like.

What is claimed is:
1. A seal structure comprising:
a housing to which a flexible wiring board is inserted; and
a seal member integrally formed with said flexible wiring board for sealing a gap between said housing and said flexible wiring board,
wherein said flexible wiring board is constructed by a base FPC constituted by an elastic material, a patterned cupper foil and an adhesive layer, conductive electromagnetic shielding layers formed on surfaces of said base FPC, and insulating layers composed of alkyd resin covering surfaces of said electromagnetic shielding layers,
wherein said seal member is composed of a self-adhesive silicone rubber; and
wherein said seal member is baked and formed integrally directly on said insulating layers of said flexible wiring board by using metal molds to provide a protruded portion having a mountain-shaped cross section.

2. A seal structure as claimed in claim 1, wherein said housing is that of an electronic device.

3. A seal structure as claimed in claim 2, wherein said electronic device is a cellular phone.

4. A seal structure as claimed in claim 1, wherein said housing is that of a water proofing connector.

5. A seal structure as claimed in claim 1, wherein said seal member is provided at each side of said flexible wiring board.

6. A seal structure as claimed in claim 1, wherein said seal member is a frame body shaped seal for sealing mating faces of said housing.

7. A seal structure as claimed in claim 1, wherein said seal member is a bush shaped seal installed to an insertion hole provided in said housing.

8. A seal structure as claimed in claim 1, wherein said seal member is constituted by a combination of said frame body shaped seal and said bush shaped seal.

* * * * *